United States Patent
Vashchenko et al.

(10) Patent No.: US 7,027,277 B1
(45) Date of Patent: Apr. 11, 2006

(54) HIGH VOLTAGE TOLERANT ELECTROSTATIC DISCHARGE (ESD) PROTECTION CLAMP CIRCUITRY

(75) Inventors: Vladislav Vashchenko, Palo Alto, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 120 days.

(21) Appl. No.: 10/851,518

(22) Filed: May 21, 2004

(51) Int. Cl.
*H02H 9/00* (2006.01)

(52) U.S. Cl. ....................................... 361/56

(58) Field of Classification Search ............. 361/56
See application file for complete search history.

(56) References Cited

U.S. PATENT DOCUMENTS

| | | | | |
|---|---|---|---|---|
| 4,786,958 A | * | 11/1988 | Bhagat | 257/137 |
| 5,216,275 A | | 6/1993 | Chen | 257/493 |
| 5,239,440 A | | 8/1993 | Merrill | 361/91 |
| 5,276,350 A | | 1/1994 | Merrill et al. | 257/603 |
| 5,276,582 A | | 1/1994 | Merrill et al. | 361/111 |
| 5,468,984 A | * | 11/1995 | Efland et al. | 357/356 |
| 6,137,143 A | * | 10/2000 | Dabral et al. | 257/355 |
| 6,841,829 B1 | * | 1/2005 | Vashchenko et al. | 257/362 |
| 2005/0029597 A1 | * | 2/2005 | Worley | 257/355 |

* cited by examiner

*Primary Examiner*—Ronald Leja
(74) *Attorney, Agent, or Firm*—Vedder Price Kaufman & Kammholz, P.C.

(57) ABSTRACT

High voltage tolerant electrostatic discharge (ESD) protection clamp circuitry including a self-triggering device having a blocking junction with a two-dimensional geometrical lateral profile.

14 Claims, 5 Drawing Sheets

HIGH VOLTAGE TOLERANT ELECTROSTATIC DISCHARGE (ESD) PROTECTION CLAMP CIRCUITRY

BACKGROUND OF THE INVENTION

1. Field of the Invention

The present invention relates to electrostatic discharge (ESD) protection circuitry, and in particular, to ESD protection circuitry tolerant of high operating voltages and signals.

2. Description of the Related Art

As is well known, a recent trend in the design of products employing significant analog circuitry includes the combining of many if not all functional blocks of analog circuitry within a single integrated circuit (IC), or "chip". Ideally, such an analog chip must be compatible with, or at least tolerant of, the voltage levels of the input and output signals, as well as the power supply for the system. Indeed, some chips must be able to provide a power supply for the output device (e.g., as is the case for many new universal serial bus, or "USB", devices) or to charge batteries during a data exchange.

One example of such a new product environment is the rapidly growing market of automotive applications. As automobiles incorporate increasingly complex and sophisticated electronic systems, power requirements for such systems increase significantly. As a result, it is now anticipated that future automotive electrical systems will have nominal power supply voltages of at least 24 volts, and perhaps as much as 42 volts. As a result, the trend toward incorporating semiconductor technology in virtually every aspect of operation and control of the automobile necessitates that each IC be compatible with such higher power supply levels.

It has been demonstrated as possible to use conventional low voltage semiconductor processing techniques to produce chips capable of operating at the new higher power supply and signal voltages. However, providing ESD protection circuitry which is tolerant of the higher operating voltages, e.g., 40–60 volts, has been more problematic.

SUMMARY OF THE INVENTION

In accordance with the presently claimed invention, high voltage tolerant electrostatic discharge (ESD) protection clamp circuitry includes a self-triggering device having a blocking junction with a two-dimensional geometrical lateral profile.

In accordance with one embodiment of the presently claimed invention, high voltage tolerant electrostatic discharge (ESD) protection clamp circuitry includes a first terminal to convey desired and undesired signals, a second terminal and self-triggering current shunting circuitry. The self-triggering current shunting circuitry is coupled between the first and second terminals, provides a conductive current path between the first and second terminals in response to the undesired signal while providing a nonconductive current path otherwise, and includes a self-triggering device having a blocking junction with a two-dimensional geometrical lateral profile.

In accordance with another embodiment of the presently claimed invention, high voltage tolerant electrostatic discharge (ESD) protection clamp circuitry includes a first terminal to convey desired and undesired signals, a second terminal, current shunting circuitry and self-triggering circuitry. The current shunting circuitry is coupled between the first and second terminals, and responsive to a control current having first and second states, wherein during the first and second control current states the current shunting circuitry provides nonconductive and conductive current paths, respectively, between the first and second terminals. The self-triggering circuitry is coupled to the first terminal and the current shunting circuitry, includes a self-triggering device having a blocking junction with a two-dimensional geometrical lateral profile, and is responsive to the desired and undesired signals by providing the control current in the first and second states, respectively, wherein during the first and second control current states the control current has substantially zero and nonzero magnitudes, respectively.

In accordance with another embodiment of the presently claimed invention, high voltage tolerant electrostatic discharge (ESD) protection clamp circuitry includes signal conveyance means for conveying desired and undesired signals, and self-triggering current shunting means, including self-triggering device means having a blocking junction with a two-dimensional geometrical lateral profile, for responding to the undesired signal by providing a conductive shunt current path while providing a nonconductive shunt current path otherwise.

In accordance with another embodiment of the presently claimed invention, high voltage tolerant electrostatic discharge (ESD) protection clamp circuitry includes self-triggering circuit means and current shunting means. The self-triggering circuit means includes self-triggering device means having a blocking junction with a two-dimensional geometrical lateral profile, and is for responding to the desired and undesired signals by generating a control current in first and second states, respectively, wherein during the first and second control current states the control current has substantially zero and nonzero magnitudes, respectively. The current shunting means is for responding to the control current by shunting substantially zero current corresponding to the desired signal during the first control current state and by shunting a nonzero current corresponding to the undesired signal during the second control current state.

DETAILED DESCRIPTION OF THE INVENTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1:
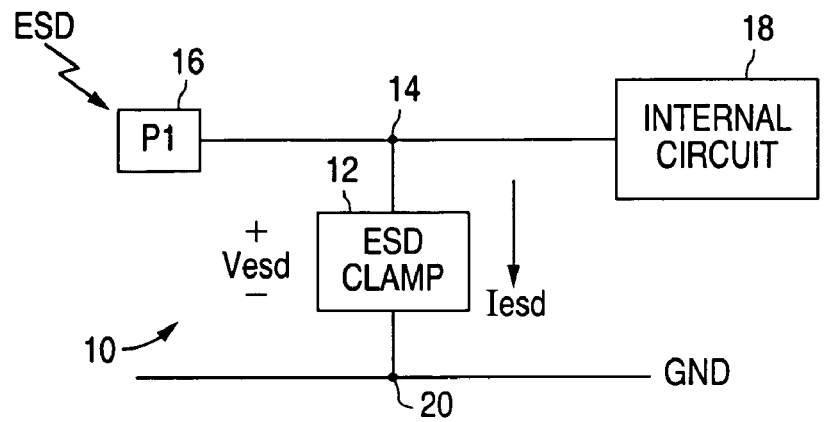
FIG. 1 is a functional block diagram of a typical topology for inclusion of ESD clamp circuitry in an integrated circuit.

Referring to FIG. 1, in a typical integrated circuit 10 employing ESD clamp circuitry 12, such circuitry 12 is coupled at a node, or electrode, 14 between an interface pad 16 and other internal circuitry 18, and the circuit reference node 20, e.g., ground. Upon occurrence of an ESD event at the interface pad 16, an ESD voltage Vesd appears across the ESD clamp circuitry 12. The ESD clamp circuitry 12 turns on, or "triggers", thereby providing a conductive current path for current Iesd associated with the ESD event.

Figure 2:
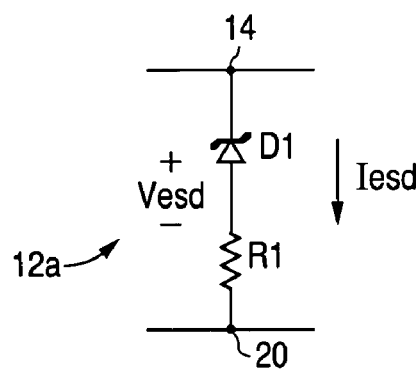
FIGS. 2–5 are schematic diagrams of examples of ESD clamp circuits in which various embodiments of the presently claimed invention can be incorporated.

Referring to FIG. 2, one form of ESD clamp circuitry 12a in which the presently claimed invention (discussed in more detail below) can be incorporated includes a diode D1 serially coupled (in any order) with a current limiting resistor R1. Upon the appearance of the ESD voltage Vesd, the diode D1 breaks down and shunts the ESD current Iesd to the circuit reference node 20.

Figure 3:
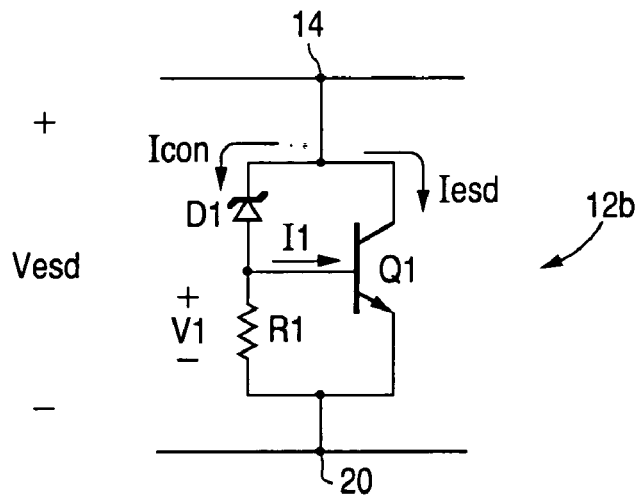

Referring to FIG. 3, another example of an ESD clamp circuit 12b in which the presently claimed invention (discussed in more detail below) can be incorporated includes a diode D1, resistor R1 and current shunting transistor Q1. In accordance with well known ESD clamp circuit principals, upon occurrence of the ESD event, the diode D1 breaks down, thereby allowing a control current Icon to flow through resistor R1, thereby producing a voltage V1 across the resistor R1 and a current 11 for driving the current shunting transistor Q1. As a result, the transistor Q1 turns on, thereby providing a conductive shunt current path for the ESD current Iesd. (It will be readily understood by one of ordinary skill in the art that while the examples of ESD clamp circuits discussed herein involve bipolar transistors as current shunting devices, such transistors can be replaced with insulated gate field effect transistors, e.g., MOSFETs, in accordance with well known circuit design principles.)

Figure 4:
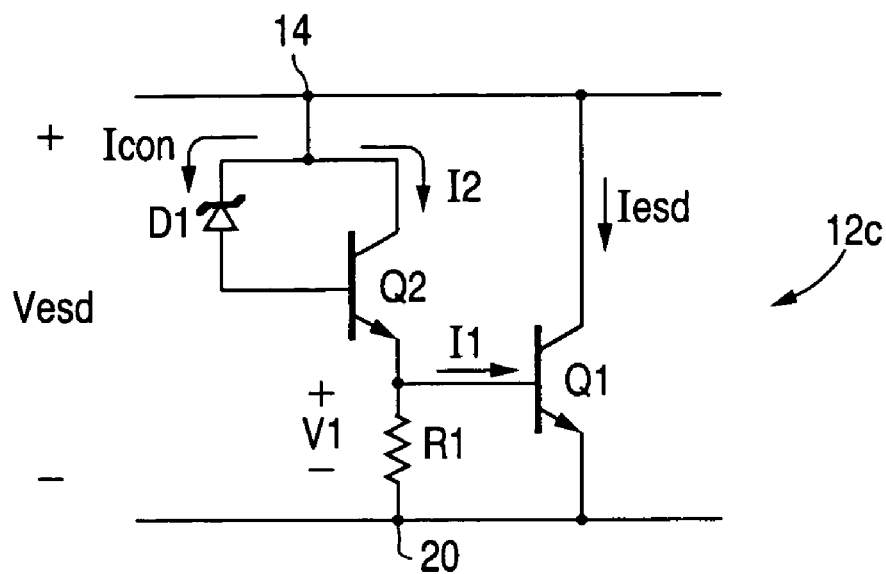

Referring to FIG. 4, another example 12c of an ESD clamp circuit in which the presently claimed invention (discussed in more detail below) can be incorporated uses a diode D1, once it has achieved breakdown, to drive the input electrode of a driving transistor Q2 which, in turn, shunts a smaller current 12 to the resistor R1. In turn, the voltage V1 generated across resistor R1 provides a drive current 11 for the primary current shunting transistor Q1 which shunts the ESD current Iesd to the circuit reference node 20.

Figure 5:
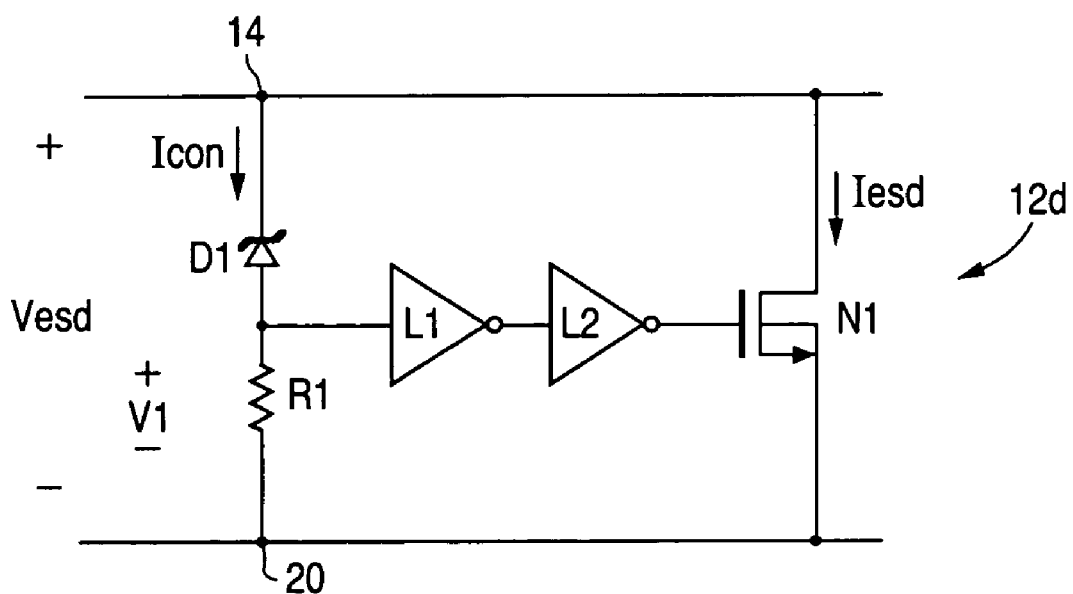

Referring to FIG. 5, another example 12d of an ESD clamp circuit in which the presently claimed invention (discussed in more detail below) can be incorporated includes a serial arrangement of diode D1 and resistor R1 as discussed above for FIG. 2. However, in this embodiment 12d, the majority of the ESD current Iesd is shunted by a MOS transistor N1 which is controlled by the voltage V1 across the resistor R1 via one or more logic inverters L1, L2.

Figure 6B:
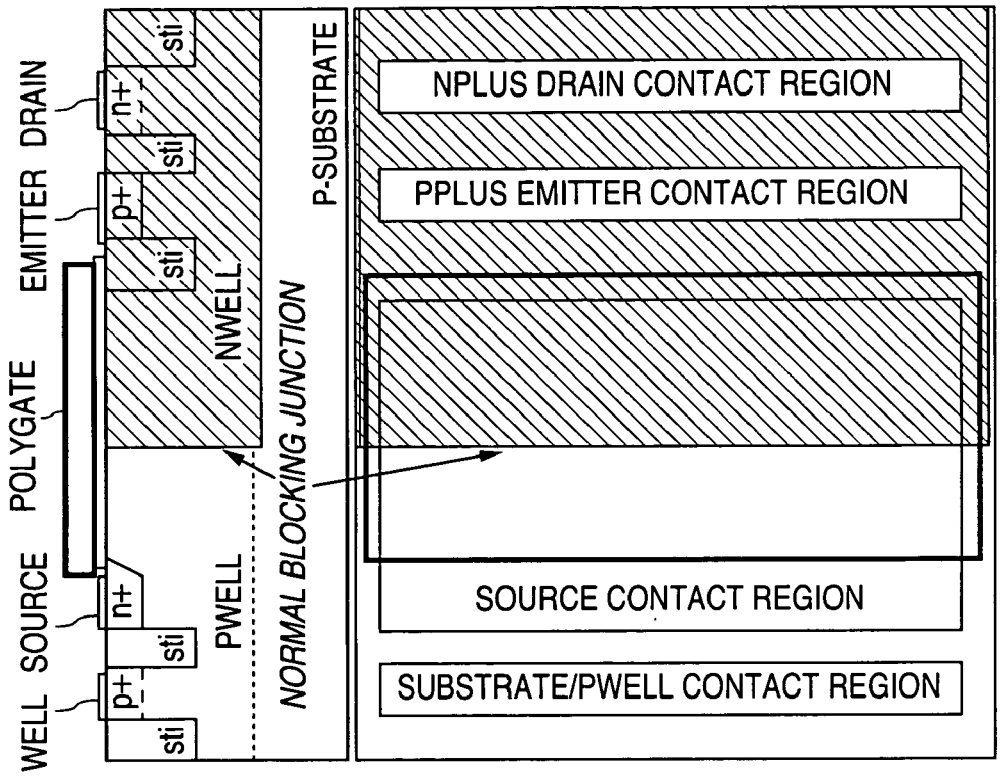
FIGS. 6A and 6B illustrate conventional topologies for a lateral silicon controlled rectifier (SCR) and a lateral double-diffused metal oxide semiconductor (LDMOS) SCR, respectively.
Figure 6A:
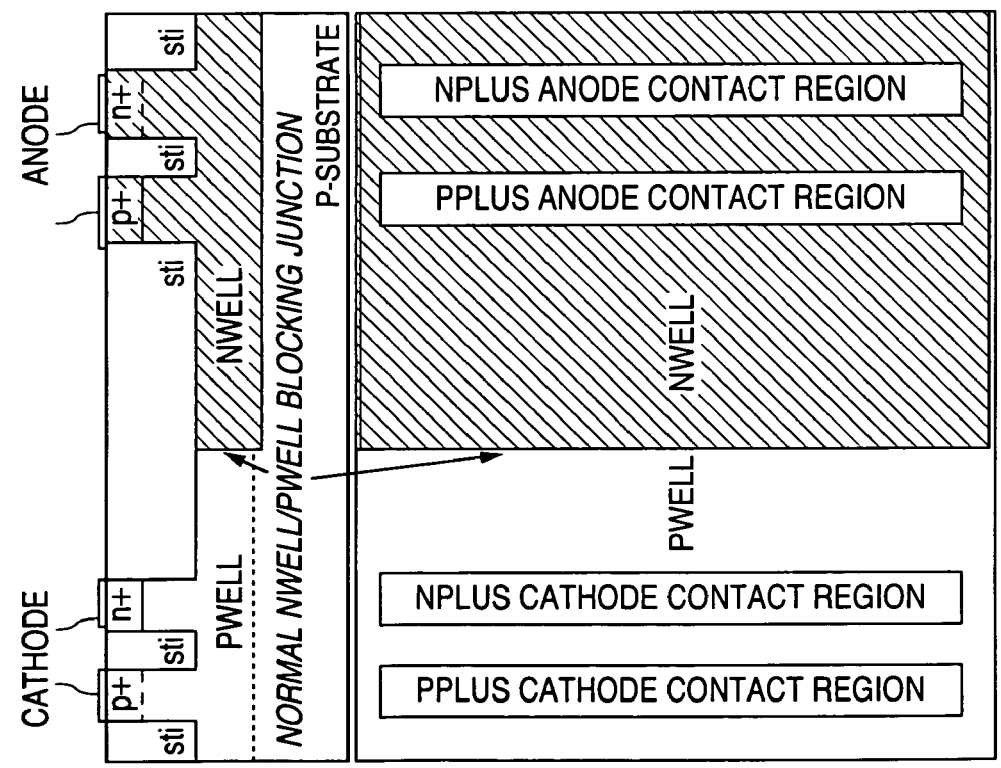

Referring to FIGS. 6A and 6B, conventional self-triggered devices often used for ESD protection circuits, such as lateral and LDMOS SCRs, respectively, have conventional blocking junctions in the form of flat junctions defined by the interface between the P-well and N-well with blocked buried layer regions. As discussed above, however, such conventional blocking junctions are typically not tolerant of the higher operating voltages and signal levels which are becoming more common.

Figures 7A, 7B:
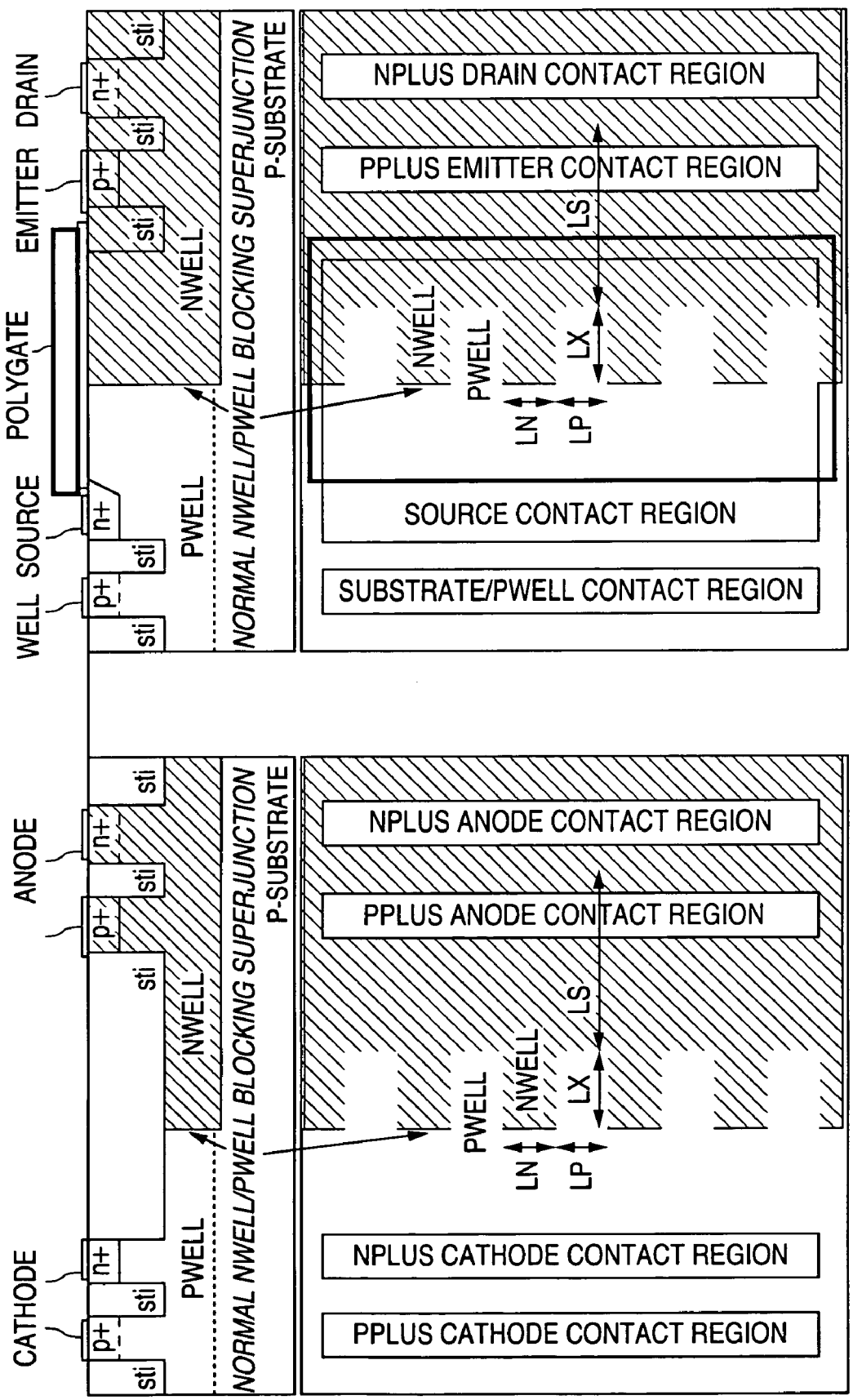
FIGS. 7A and 7B illustrate topologies for a lateral SCR and a LDMOS SCR, respectively, in accordance with alternative embodiments of the presently claimed invention.

Referring to FIGS. 7A and 7B, breakdown voltages of self-triggering devices, such as lateral and LDMOS SCRs, respectively, in accordance with alternative embodiments of the presently claimed invention, can be increased by introducing periodic alterations to the profile of the blocking junction to create a "super junction". In other words, the blocking junction can be implemented with a two-dimensional geometrical lateral profile, as shown, in which a rectilinear pattern, e.g., a gap-toothed pattern as shown, can be used to increase the breakdown voltage by "stretching" the electric field along the junction. Such "stretching" of the electric field is achieved by virtue of the fact that when the blocking junction is implemented with a two-dimensional geometrical lateral profile (FIGS. 7A and 7B) instead of a conventional "flat" profile (FIGS. 6A and 6B), the length of the profile, in linear dimensional units, becomes greater, thereby creating a longer distance over which the electric field between the drain region and the gate electrode (which is usually coupled to circuit ground via resistance) is distributed. As a result, for a given drain voltage, the electric field per unit length along the profile is reduced, thereby minimizing generation of hot carriers capable of overcoming the interfacial energy barrier and becoming trapped in or tunneling through the gate oxide.

Figure 8B:
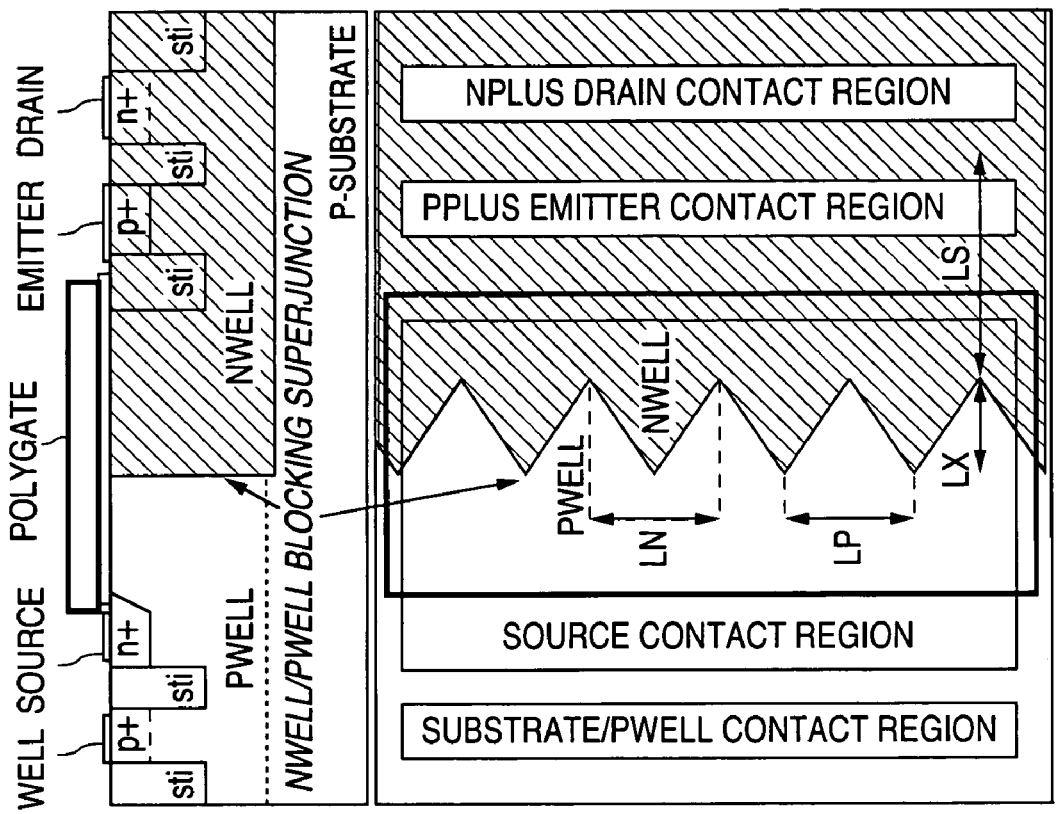
FIGS. 8A and 8B illustrate topologies for a lateral SCR and a LDMOS SCR, respectively, in accordance with further alternative embodiments of the presently claimed invention.
Figure 8A:
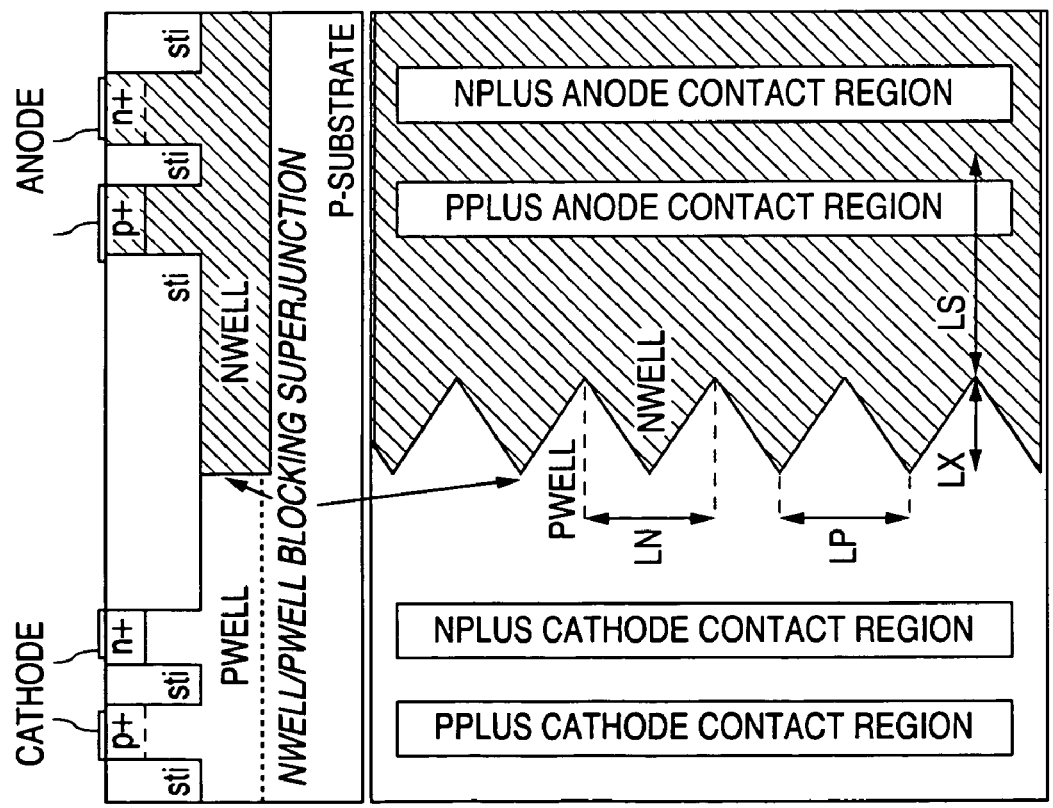

Referring to FIGS. 8A and 8B, lateral and LDMOS SCRs, respectively, in accordance with further alternative embodiments of the presently claimed invention can be implemented such that the rectilinear pattern of the two-dimensional geometrical lateral profile of the blocking junction, as shown, is in the form of a sawtooth pattern, e.g., a series of serrations.

As is well known, the effect on the breakdown voltage is a function of the height LX and width dimensions LN, LP of the N-well and P-well "teeth", as well as the doping profiles within such regions. In a preferred embodiment, the relative width dimensions LN, LP of the N-well and P-well "teeth" would be substantially equal, thereby producing substantially symmetrical "teeth". As either of these dimensions LN, LP increases beyond a predetermined value (readily determined according to the material properties, doping concentrations, etc.), the performance of such a blocking junction would approach that of the conventional "flat" profile since the now dominant dimension (LN or LP) would approximate a conventional "flat" profile. Regarding the relative height dimension LX, taller is generally better, although the height LX should not be so great as to extend to the shallow trench isolation STI adjacent the p+contact for the drain electrode, i.e., the teeth-STI separation distance LS should be greater than zero. In any event, the absolute height LX and width dimensions LN, LP must be greater than respective predetermined minimum values (readily determined according to the material properties, doping concentrations, etc.); otherwise no super junction is effectively formed.

In accordance with the foregoing discussion, it will be readily understood by one of ordinary skill in the art that the use of a super junction in accordance with the presently claimed invention can be used in other contexts as well. For example, extended drain MOS transistors can benefit from the use of a super junction between the p-and n-wells. As discussed above, such a junction distributes the electric field, thereby reducing the number of potential hot carriers generated, as well as increasing the breakdown voltage. As a result, such MOS transistors can be operated at higher system voltages with greater efficiency and reliability.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including high voltage tolerant electrostatic discharge (ESD) protection clamp circuitry, comprising:
    a first terminal to convey desired and undesired signals;
    a second terminal; and
    self-triggering current shunting circuitry, coupled between said first and second terminals, that provides a conductive current path between said first and second terminals in response to said undesired signal while providing a nonconductive current path otherwise, and includes a self-triggering device having a blocking junction with a two-dimensional geometrical lateral profile having a plurality of connected patterns extending along at least a portion of one of said two dimensions.

2. The apparatus of claim 1, wherein said two-dimensional geometrical lateral profile comprises a rectilinear pattern.

3. The apparatus of claim 1, wherein said two-dimensional geometrical lateral profile comprises a gap-toothed pattern.

4. An apparatus including high voltage tolerant electrostatic discharge (ESD) protection clamp circuitry, comprising:
    a first terminal to convey desired and undesired signals;
    a second terminal;
    current shunting circuitry coupled between said first and second terminals, and responsive to a control current having first and second states, wherein during said first and second control current states said current shunting circuitry provides nonconductive and conductive current paths, respectively, between said first and second terminals; and
    self-triggering circuitry coupled to said first terminal and said current shunting circuitry, including a self-triggering device having a blocking junction with a two-dimensional geometrical lateral profile, and responsive to said desired and undesired signals by providing said control current in said first and second states, respectively, wherein during said first and second control current states said control current has substantially zero and nonzero magnitudes, respectively.

5. The apparatus of claim 4, wherein said current shunting circuitry comprises one or more transistors with one or more respective control terminals coupled to said current tunneling circuitry.

6. The apparatus of claim 5, wherein:
    said one or more transistors comprises one or more bipolar junction transistors; and
    said one or more respective control terminals comprises one or more respective base terminals of said one or more bipolar junction transistors.

7. The apparatus of claim 5, wherein:
    said one or more transistors comprises first and second bipolar junction transistors mutually coupled in a Darlington configuration; and
    said one or more respective control terminals comprises a base terminal of said first bipolar junction transistor.

8. The apparatus of claim 5, wherein:
    said one or more transistors comprises one or more insulated gate field effect transistors (IGFETs); and
    said one or more respective control terminals comprises one or more respective gate terminals of said one or more IGFETs.

9. The apparatus of claim 8, wherein said one or more IGFETs comprises one or more metal-oxide-semiconductor field effect transistors (MOSFETs).

10. The apparatus of claim 4, wherein said current shunting circuitry comprises:
    one or more transistors with one or more respective control terminals; and
    one or more serially coupled voltage inversion circuits coupled between said current tunneling circuitry and said one or more transistor control terminals.

11. The apparatus of claim 4, wherein said two-dimensional geometrical lateral profile comprises a rectilinear pattern.

12. The apparatus of claim 4, wherein said two-dimensional geometrical lateral profile comprises a gap-toothed pattern.

13. An apparatus including high voltage tolerant electrostatic discharge (ESD) protection clamp circuitry, comprising:
    signal conveyance means for conveying desired and undesired signals; and
    self-triggering current shunting means, including self-triggering device means having a blocking junction with a two-dimensional geometrical lateral profile having a plurality of connected patterns extending along at least a portion of one of said two dimensions, for responding to said undesired signal by providing a conductive shunt current path while providing a nonconductive shunt current path otherwise.

14. An apparatus including high voltage tolerant electrostatic discharge (ESD) protection clamp circuitry, comprising:
    self-triggering circuit means, including self-triggering device means having a blocking junction with a two-dimensional geometrical lateral profile, for responding to said desired and undesired signals by generating a control current in first and second states, respectively, wherein during said first and second control current states said control current has substantially zero and nonzero magnitudes, respectively; and
    current shunting means for responding to said control current by shunting substantially zero current corresponding to said desired signal during said first control current state and by shunting a nonzero current corresponding to said undesired signal during said second control current state.

* * * * *

UNITED STATES PATENT AND TRADEMARK OFFICE
CERTIFICATE OF CORRECTION

PATENT NO. : 7,027,277 B1 Page 1 of 1
APPLICATION NO. : 10/851518
DATED : April 11, 2006
INVENTOR(S) : Vladislav Vashchenko et al.

It is certified that error appears in the above-identified patent and that said Letters Patent is hereby corrected as shown below:

Column 3,
Lines 42 and 57, delete "11" and insert -- I1 --.
Line 56, delete "12" and insert -- I2 --.

Signed and Sealed this

Twentieth Day of June, 2006

JON W. DUDAS
*Director of the United States Patent and Trademark Office*